United States Patent [19]
Kelley et al.

[11] 4,334,222
[45] Jun. 8, 1982

[54] OPTICAL SELECTOR SWITCH AND DISPLAY APPARATUS

[75] Inventors: Michael R. Kelley; Jack E. Emfinger, both of Phoenix; Michael A. Dassele, Scottsdale, all of Ariz.

[73] Assignee: Sperry Corporation, New York, N.Y.

[21] Appl. No.: 130,310

[22] Filed: Mar. 14, 1980

[51] Int. Cl.³ .................... G08C 19/36; G08C 19/16
[52] U.S. Cl. .................... 340/870.29; 250/231 SE; 340/347 P; 340/870.20; 340/870.19
[58] Field of Search .................... 340/190, 201 P, 206, 340/203, 204, 188 R, 189 R, 347 M, 347 P, 870.02, 870.29, 870.28, 870.19, 870.22, 870.24, 870.11, 870.23, 870.20; 250/231 SE; 346/14 MR

[56] References Cited

U.S. PATENT DOCUMENTS

| | | | |
|---|---|---|---|
| 3,728,551 | 4/1973 | Culver et al. | 250/231 SE |
| 3,814,934 | 6/1974 | Mesh et al. | 250/231 SE |
| 4,079,251 | 3/1978 | Osann | 250/231 SE |
| 4,086,580 | 4/1978 | Schroeder | 340/190 |
| 4,117,320 | 9/1978 | Tomlinson et al. | 250/231 SE |
| 4,194,184 | 3/1980 | Hartmann et al. | 250/231 SE |

*Primary Examiner*—James J. Groody
*Attorney, Agent, or Firm*—Howard P. Terry

[57] ABSTRACT

An optical pulse-forming switch includes a pair of spaced apart photodetectors and a rotatable shutter arranged to permit sequentially illuminating first one photodetector and then the other, depending on the sense of rotation, to produce out-of-phase pulse trains. The optical pulse-forming switch is interfaced with a pair of synchronized flip-flops and a phase detection counter control circuit which senses rotation extent and direction. The counter control circuit drives a counter that stores the number of passed angular increments and stores direction of rotation, the counter being interrogated and reset at regular time intervals. Thus, the input shaft rotation is converted into a digital quantity by maintaining a running summation of counter values. The operator reference indicator is accordingly brought up to date following each input conversion.

11 Claims, 8 Drawing Figures

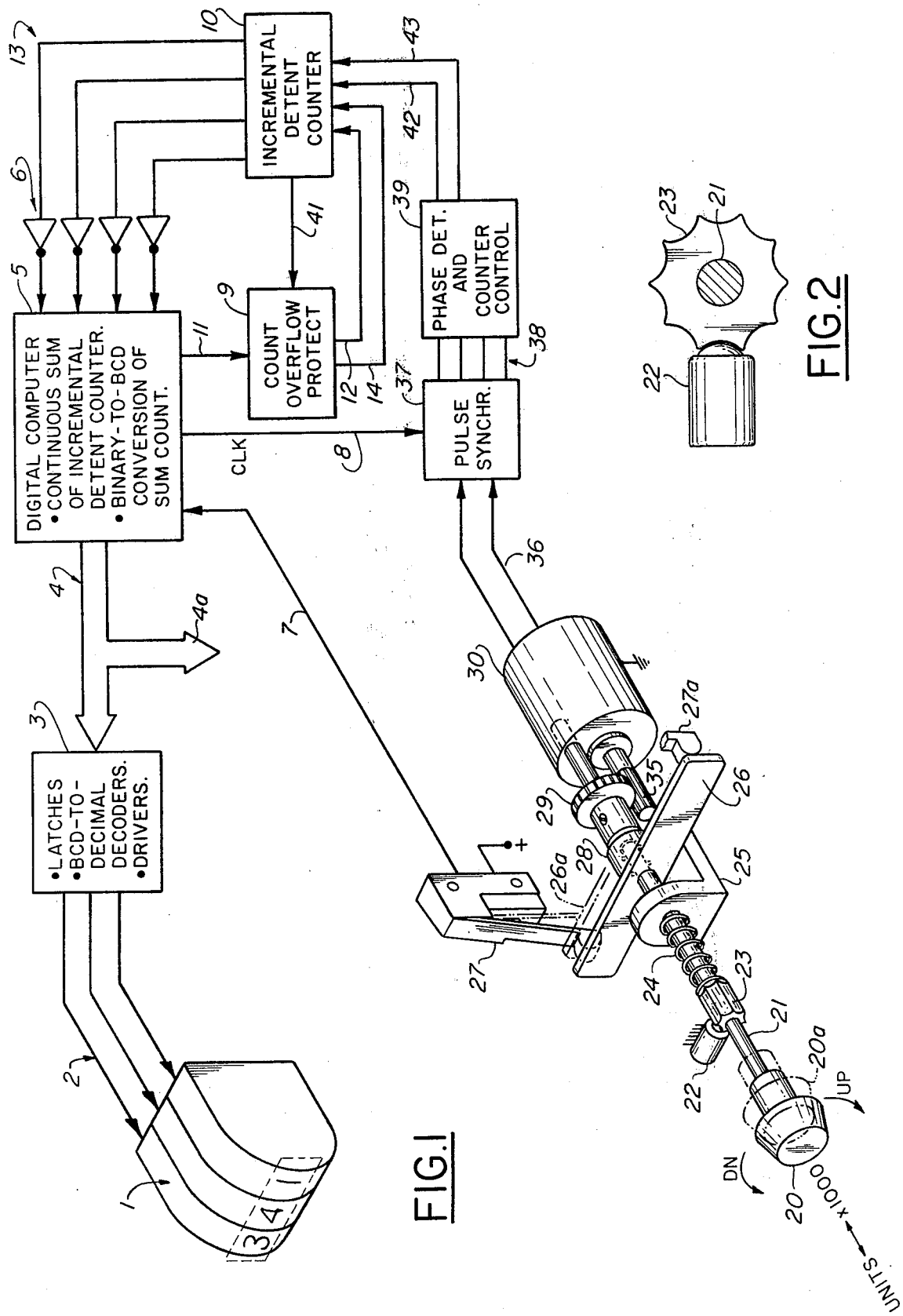

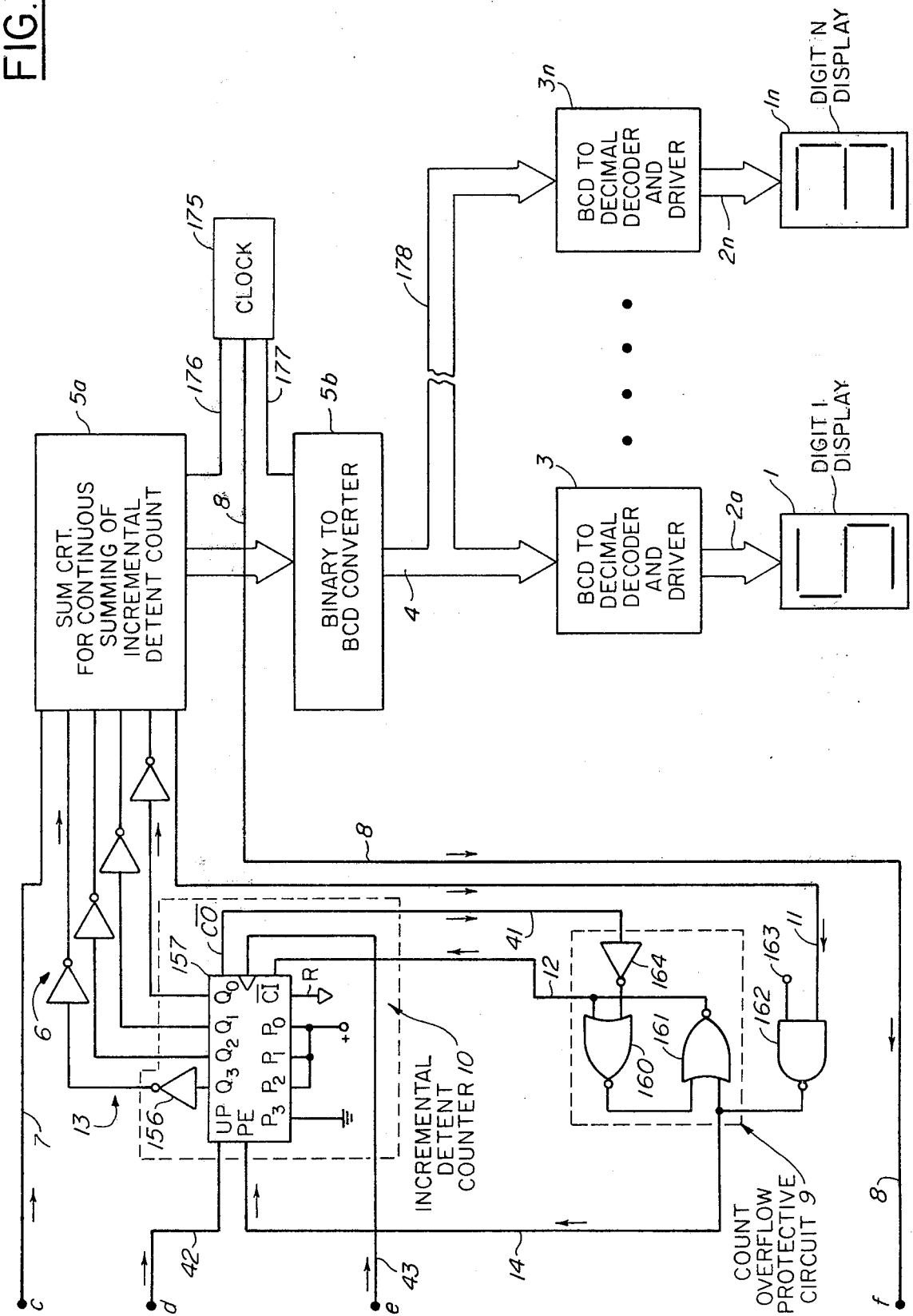

OPTICAL SELECTOR SWITCH AND DISPLAY APPARATUS

BACKGROUND OF THE INVENTION

1. Field of the Invention

The invention relates generally to numerical display apparatus and more particularly to apparatus for automatically converting a shaft rotation into digital signals for computer processing and for display on an operator's reference indicator.

2. Description of the Prior Art

In the prior art, conversion of shaft angle into a digital representation has been accomplished by using a shaft-driven synchro and associated electronic analog-to-digital conversion apparatus, by a coded wafer contacting switch, or by a binary coded optical shaft encoder. The first approach demands the use of a synchro data transmitter that must be precise and electrically balanced and which is therefore expensive. In addition, analog-to-digital converters are known to be sensitive to temperature and to other ambient effects unless suitable compensation is made. While they are fundamentally simple, coded wafer contacting switches exhibit electrical arcing and contact bounce at least after a period of use and thereby cause undesirable errors in associated electronic equipment. Commercially available optical shaft encoders are too large for incorporation in locations such as aircraft control panels and are, in addition, quite expensive.

SUMMARY OF THE INVENTION

It is the objective of the present invention to provide a shaft angle pick-off and display system devoid of the problems associated with the prior art. The device is easily made precise and eliminates the need for an analog-to-digital converter. Arcing and contact bounce phenomena are eliminated. Because of its simplicity, the novel pick-off may itself easily be made smaller than commercial optical encoders in sizes equivalent to those of the smaller synchro devices.

The invention includes an optical pulse-forming switch interfaced with a pair of synchronized flip-flops and a phase detection and counter control circuit which senses rotation extent and direction. The counter control circuit drives a counter that stores the number of passed angular increments and stores direction of rotation, the counter being interrogated and reset at regular time intervals. Thus, the input shaft rotation is converted into a digital quantity by maintaining a running summation of counter values. The operator reference indicator is accordingly brought up to date following each input conversion.

BRIEF DESCRIPTION OF THE DRAWINGS

FIG. 1 is a schematic representation of the invention showing a perspective view of the mechanical parts of the invention together with electrical components and their interconnections.

FIG. 2 is a view of partial cross-section of the detent element of FIG. 1.

FIGS. 7A and 7B are together a detailed wiring diagram of the electrical or signal processor portion of FIG. 1.

DESCRIPTION OF THE PREFERRED EMBODIMENTS

Figure 3:
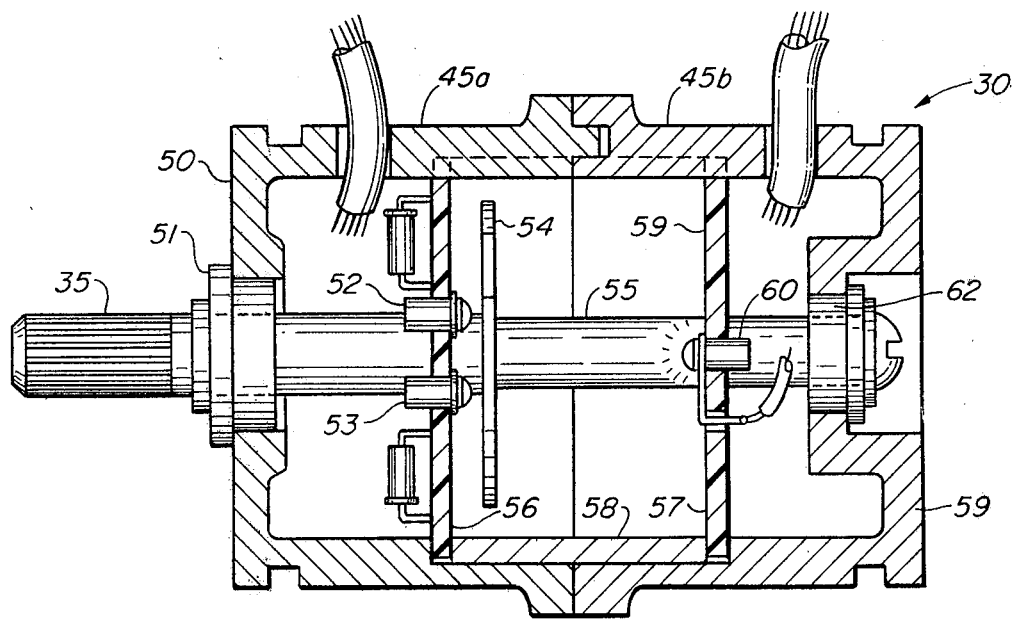
FIG. 3 is a cross-section view of the pick-off of FIG. 1.

In FIG. 1, there is illustrated a system whereby an operator may use a mechanically rotatable knob 20 to set a selected command value into a computer 5 and simultaneously to display that selected value in a conventional numerical display 1. The apparatus may also be employed, for example, to set into a cooperating universal or specialized computer any kind of data for employment therein for the control of a navigation system. For example, the novel selector-display may be used to handle any one of a variety of automatic pilot command parameters, such as altitude, vertical air speed, craft heading, air speed, or the like. Any one of a wide variety of types of display devices 1 may be used in the invention, including numerical displays such as the common mechanical wheel counter display.

The opto-mechanical portion of the novel system may be understood from FIGS. 1 through 6 in general relation to the cooperating electrical parts. Referring particularly to FIG. 1, the knob 20 is mounted on a shaft 21 which may be rotated with respect to a bearing within a support bracket 25 affixed to an instrument panel of the craft, as is the case of the optical pick-off 30. The rotational positions of knob 20 and of shaft 21 are restrained to ten possible positions by the conventional detent 22 and detent wheel 23, shown also in the enlarged view of FIG. 2, detent wheel 23 being fixed on shaft 21. Any rotation of shaft 21 is conveyed through gear 29 to the smaller input gear 35 of pick-off 30. In one embodiment of the invention, a five to one gear ratio is used, so that gear 35 rotates five times for each rotation of gear 29.

One advantageous feature of the invention lies in the apparatus shown in FIG. 1 whereby the scale factor of display 1 may be changed at the will of the operator. For example, in an altitude select system, the presentation of display 1 may be shifted from hundreds to thousands of feet altitude and computer 5 and associated apparatus may be at the same time alerted of that change for compensation therefor.

For the scale controlling purpose, knob 20 and shaft 21 may be translated along the axis of shaft 21 to the position represented at 20a, whereby the switch armature 26 is also translated to position 26a. Armature 26 is supported on shaft 21 by bearing 28 and is constrained from rotation by its proximity to the upper surface of bracket 25, for example. Miniature switches, such as switches 27 or 27a, are actuated by the translation motion of armature 26 and are returned to their original positions when spring 24 returns shaft 21 and knob 20 to their normal or initial translational positions. It will be clear to those skilled in the art that computer 5 may be equipped with a program or a conventional discrete computing unit for accomplishing such scale changes, so that the count supplied to display 1 actuates the device as a 1000 foot display rather than as a 100 foot display, or vice versa, at the will of the operator.

Still referring to FIG. 1, the encoded output of pick-off 30 is coupled via leads 36 into a pulse synchronizer 37 along with clock signals on lead 8; the synchronizer 37 output flows via a plurality of leads 38 into phase detector and counter control 39. Circuit 39 has the mission of identifying the direction of rotation of knob 20 and of detecting each detent passage. The output of circuit 39 on leads 42, 43 drives an incremental counter 10, which may take the form of a conventional up-down counter that stores the number of detents passed and also information representing the direction of rotation of knob 20. Counter 10 is interrogated and reset at regular intervals by a conventional general or specific purpose computer 5, which converts the data stored in up-down counter 10 and supplied by leads 13 to the computer through a corresponding plurality of inverting amplifiers 6, thus maintaining a running summation of counter values therewithin. It is understood that computer 5 contains at least two conventional elements, a sub-system 5a for the continuous summation of the incremental detent counter outputs and, responsive to sub-system 5a, a sub-system 5b for converting the foregoing summation by binary-to-BCD conversion into signals of a character useful in a conventional display system 1, 2, 3 or, via leads 4a, in a flight control system or navigation computer.

The display system is responsive to signals on leads 4 and includes a conventional serially active combination 3 of input signal latches, BCD-to-decimal decoders, and drivers. The latter elements supply control signals via leads 2 to operate the individual dials of display 1 for presenting the commanded series of digits. The operator's reference display 1 is thus up-dated with a converted input following each input conversion. The counter 10 interrogation interval is so fixed that it is extremely improbable that the incremental detent count of up-down counter 10 will exceed the capacity of that counter. However, this undesired event may sometimes occur, so that the overflow protection circuit 9 is provided. The synchronization of pulse synchronizer 37 is achieved by clock pulses on lead 8 which may arise in the clock controlling computer 5, and is gated off during computer interrogation, thereby guaranteeing stable data during count transfer into computer 5.

The internal nature of pick-off 30 may be understood from FIGS. 3 through 6. Gear 35 of FIG. 1 is integral with a shaft 55 journalled in the respective bearings 51, 62 in the end portions 50, 59 of the split cylindric casing 45a, 45b of pick-off 30. Two plastic circuit boards 56, 57 are mounted within casing 45a, 45b, being securely held in place by inserts such as insert 58. The two halves 45a, 45b of the casing may be secured together by conventional fasteners (not shown).

Figures 4, 5:
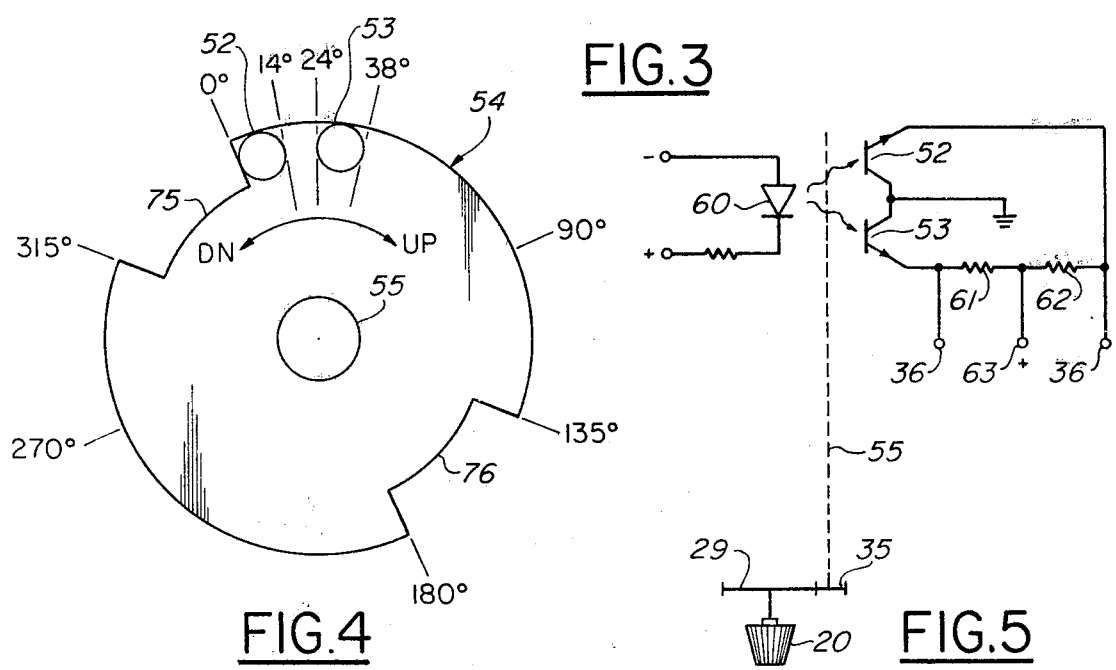
FIG. 4 is an elevational view of the shutter shown in FIG. 3.
FIG. 5 is an electrical wiring diagram of a circuit employed within the pick-off of FIG. 3.

A light emitting electroluminescent diode 60, or other suitable light source, is supported by circuit board 59 and may be illuminated as in FIG. 5 by a suitable electrical source. A matched pair of diode or other light detectors 52, 53 is similarly disposed on the second circuit board 56 above shaft 55 so that they may receive light from source 60. As in FIG. 5, detectors 52, 53 are coupled in series with resistors 61, 62; the common junction of detectors 52, 53 is coupled to ground, while a suitable operating voltage is coupled to terminal 63 common to resistors 61, 62. The useful output to be supplied via leads 36 to pulse synchronizer 37 is derived across resistors 61, 62. A redundant set of two detectors and a light source may be disposed on the opposite side of shaft 55.

Interposed between light source 60 and the detector pair 52, 53 is a rotatable shutter 54 seen best in FIG. 4. It is affixed upon shaft 55 for rotation therewith and is provided with equiangular diametrically opposed cutout portions 75, 76 disposed so that the shutter displays diametral symmetry. As shutter 54 is rotated clockwise with respect to its zero position, detector 52 is the first to see light from source 60, while detector 53 sees it momentarily later, as at 52a and 53a in FIG. 6. However, should shutter 54 be rotated counter-clockwise with respect to its zero position, detector 53 is first illuminated, while detector 52 receives light momentarily later. In other words, the order in which detector 52, 53 outputs 52a, 53a appear on leads 36 conveys information as to whether the commanded value is greater or lesser than the immediately prior value. Further, the number of pulses 52a or 53a conveys information as to the magnitude of the commanded change.

Figure 6:
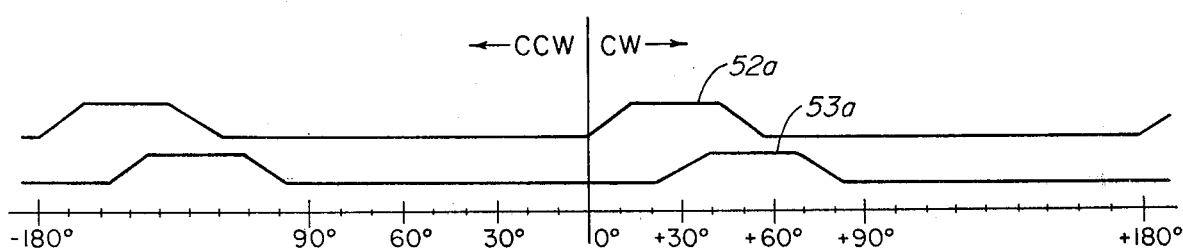
FIG. 6 is a graph useful in explaining the operation of the invention.
Figure 7A:
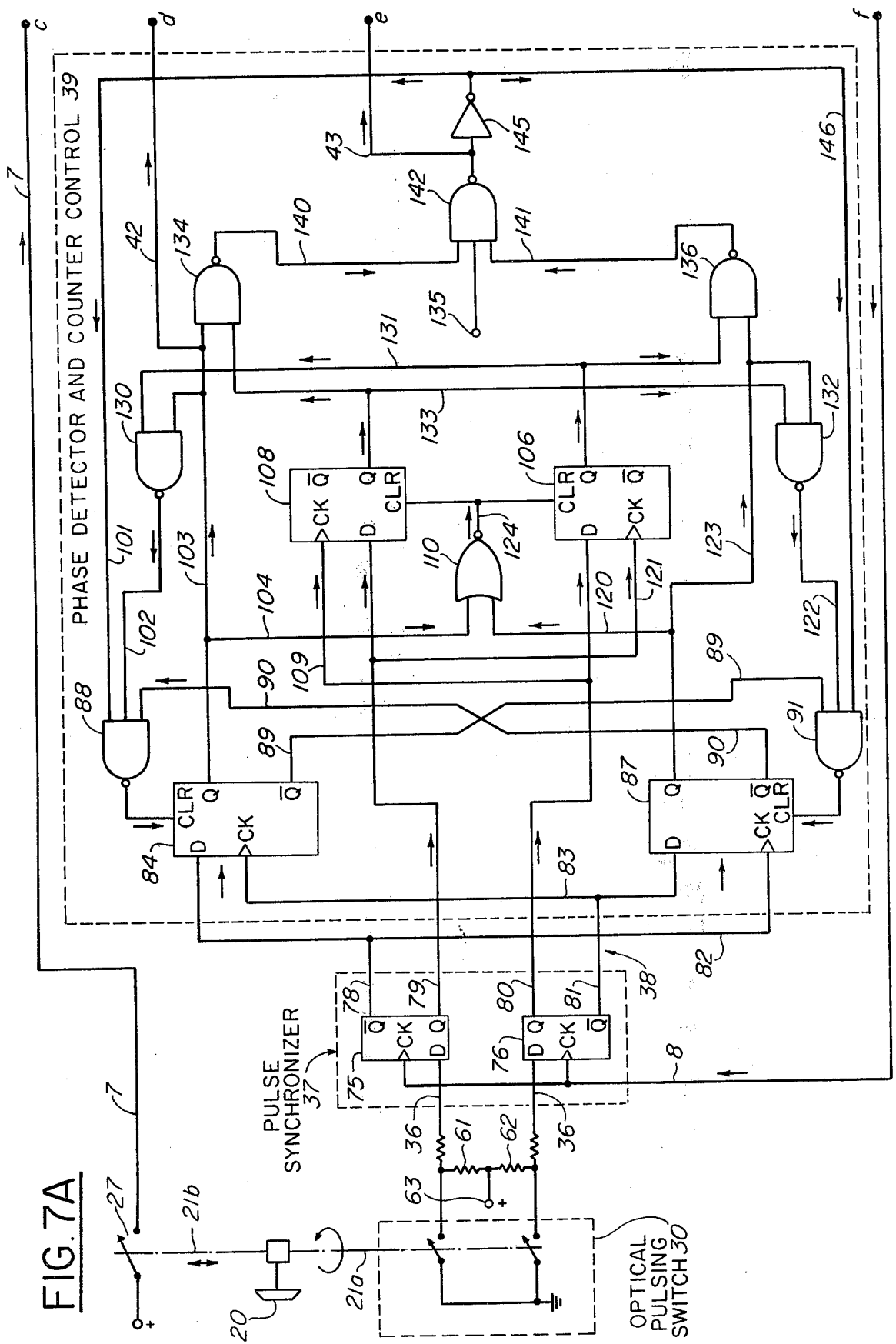

Referring now to FIG. 7A, the optical pick-off or optical pulse generating switch 30 is shown only schematically as supplying across resistors 61, 62 the signals of FIG. 6 to the pulse synchronizer 37. The leads 36 are coupled to the data inputs D of synchronized flip-flops 75, 76 included within pulse synchronizer 37. Flip-flops 75, 76 additionally have synchronizing clock inputs CK supplied via lead 8 from clock 175, which clock may also control computer elements 5a, 5b. Flip-flops 75, 76 each supply Q and $\overline{Q}$ outputs via their respective output leads 78, 79, 80, 81.

The outputs of flip-flops 75, 76 are supplied to inputs of phase detector and counter control 39. For example, the $\overline{Q}$ output of flip-flop 75 on lead 78 goes via lead 82 to the data input D of flip-flop 84 of the phase detector section and also to the clock input CK of a similar flip-flop 87. Conversely, the $\overline{Q}$ output of flip-flop 76 on lead 81 goes via lead 83 to the clock input CK of flip-flop 84 in the phase detection section and to the data input D of flip-flop 87. Flip-flops 84, 87 are respectively supplied with clearing terminals CLR operated by signals from the respective NAND gates 88, 91, each supplied with a trio of input signals from sources yet to be discussed.

The Q output of flip-flop 75 of pulse synchronizer 37 is coupled via lead 79 to the data input D of flip-flop 108 and via lead 121 to the clock terminal of flip-flop 106. Conversely, the Q output of flip-flop 76 is connected via lead 80 to the data input D of flip-flop 106 and via lead 105 to the clock input CK of flip-flop 108. The respective Q outputs of flip-flops 84, 87 are coupled by leads 104, 120 to the inputs of NOR gate 110, whose output is conveyed by lead 124 to the clearing terminals CLR of flip-flops 108, 106.

The Q output of flip-flop 108 flows via lead 133 to inputs of NAND gates 134, 132, while the Q output of flip-flop 106 flows via lead 131 to the inputs of NAND gates 130, 136. The respective second inputs for NAND gates 134, 136 come from the respective Q outputs of flip-flops 84, 87 via the respective leads 103, 123. The outputs of NAND gates 134, 136 flow through the respective leads 140, 141 to two of the inputs of NAND gate 142, which gate has a third input 135 for a signal representative of the fact that operating power has been supplied to the system. The output of NAND gate 142 is supplied from the counter control section via lead 43 to the incremental detent up-down counter 10 of FIG. 7B. When power is first switched on, a short-duration pulse is immediately supplied from a conventional power supply source which sets all memory circuits (the flip-flop and counter) in a conventional manner to a predetermined condition; i.e., the flip-flops are cleared, while the counter is preset to mid-range value 0 1 1 1.

For controlling the sequence of operation of the circuit of FIG. 7A, the flip-flop 84 Q output on lead 103 is coupled to one input of NAND gate 130, the other input thereto receiving the Q output of flip-flop 106 via lead 131. The output of NAND gate 130 is sent via lead 102 to one of three inputs of NAND gate 88. A second input to NAND gate 88 is the $\overline{Q}$ output of flip-flop 87 on lead 90. A third input is generated by the output of NAND gate 142 and the inverting amplifier 145 and is supplied through lead 101 to NAND gate 88, all for the control of the clearing terminal CLR of flip-flop 84.

A generally analogous circuit involves NAND gates 132 and 91. The flip-flop 87 Q output on lead 123 is coupled to one input of NAND gate 132, the other input thereto receiving the Q output of flip-flop 108 via lead 133. The output of NAND gate 132 is sent via lead 122 to one of three inputs of NAND gate 91. A second input of NAND gate 91 is the $\overline{Q}$ output of flip-flop 84 on lead 89. A third input is again generated by the output of NAND gate 142 and the inverting amplifier 145 and is supplied through lead 146 to NAND gate 91, all for the control of the clearing terminal CLR of flip-flop 87.

In operation, assume that the rotation of the manual input knob 20 is to be such as to produce an up count in counter 10. The signal 52a of FIG. 6 is first to rise as knob 20 is rotated out of its initial detent. The fact of the occurrence of this input signal rise is indicated by the stored level of the Q output of flip-flop 84 upon the first subsequent rising of signal 53a, which will be last up in this case. If rotation of knob 20 is continued over the detent ridge to the next detent valley position, signal 52a is the first to drop. This sets the Q output of flip-flop 108 when the falling edge of signal 53a occurs. The state of the Q output of flip-flop 84 indicates on lead 42 that an up count is to be taken by counter 10 and the logical combination of the outputs of the Q outputs of flip-flops 84 and 108 produces a counter clock on lead 43. This clock signal, when coupled to the clock input of counter 10, increments counter 10 by one unit. The same clock signal resets the Q output of flip-flop 84, which event also resets the output of the Q terminal of flip-flop 108. The cycle is completed, all elements being put back in condition for the initiation and completion of a second cycle when commanded. It will be observed that circuit 39 is mirror symmetric and, because of this symmetry, its second half operates in an analogous manner when knob 20 is rotated to produce a down count in counter 10, flip-flops 87 and 106 being involved, for example, in place of flip-flops 84 and 108.

A feature of the phase detector and counter control logic circuit 39 lies in the fact that it substantially eliminates the possibility of multiple counts by counter 10 which might otherwise be caused by rotational noise due to mechanical jitter induced, for example, by any uncoordinated manual operation of knob 20. For example, false counts might otherwise be produced by partial rotation of knob 20 just short of the point at which the detent 22 would slip over a ridge of detent wheel 23, so that knob 20 then returns to the last secured detent valley position. The problem is discriminated against by gates 134 and 136 in the invention by ensuring that the first of signals 52a, 53a to be up is also the first signal to drop to the zero level. In the foregoing example, elimination of these undesirable effects is also promoted by holding the Q outputs of flip-flops 106, 108 reset until either the Q output of flip-flop 84 or of flip-flop 87 is set and also by holding the Q output of flip-flop 87 reset by the Q output of flip-flop 84 and the Q output of flip-flop 84 reset by the Q output of flip-flop 87. The triple-input NAND gates 88, 91 clear the first up flip-flops if a counter clock occurs, or if the opposite flip-flop is first up, or the first up signal is not also the first down signal thus indicating that full rotation to the next detent valley was not accomplished.

Accordingly, the outputs of the phase detector and counter control 39 appear on leads 42 and 43 for transfer to the incremental detent up-down counter 10 of FIG. 7B. Counter 10 is a conventional semiconductor microcircuit available on the market and having several terminals including terminals $Q_0$, $Q_1$, $Q_2$ and $Q_3$ and terminals:

UP is the count-up count-down terminal,
$\overline{CO}$ is a carry-out terminal,
$\overline{CI}$ is a carry-in terminal,
$P_0$, $P_1$, $P_2$, and $P_3$ are terminals set at predetermined fixed voltage values, as indicated in the drawing,
PE is a preset-enable terminal, and
R is the grounded reset terminal.

A clock terminal is also provided. With respect to the terminal marked UP, it receives both count-up or high signals and count-down or low signals on lead 42 by virtue of receiving binary input.

The signal transitions on lead 43 represent the number of detents passed and are applied to the clocking terminal of counter 10. The signal on lead 42 is derived from one or the other side of the phase detector system 39 and is coupled to the UP terminal of up-down counter 10. The $Q_0$, $Q_1$, $Q_2$, and $Q_3$ outputs of counter 10 are applied through a plurality of leads 13 and a corresponding array of inverting amplifiers 6 to the conventional sum circuit 5a for continuous summing of the incremental detent counts. The $Q_3$ output of counter 10 is double inverted because of the presence of a second inverter 156. The inverters 6 serve two purposes; first, these inverters convert the outputs of counter 10 from off-set binary to two's complement logic. Secondly, they serve as buffers. As to the inverters in the $Q_3$ output, that output needs at least one buffer and two inverters are used in series to preserve polarity. Accordingly, it is seen that the phase detector and control circuit 39 of FIG. 7A drives the incremental two's complement up-down counter 10 which stores the number of detents passed in any one incremental operation of knob 20 and its corresponding direction of rotation. The counter 10 is interrogated and reset at regular intervals by computer element 5a by signals passed by leads 11, 14 and NAND gate 162 to the preset-enable terminal PE of counter 10. A second input terminal 163 of NAND gate 162 accepts a signal that represents the presence of operating power.

For the protection of system operation against count overflow in counter 10, the carry-out terminal $\overline{CO}$ thereof is fed by lead 41 to inverting amplifier 164 and thence to one input of NOR gate 160. The second input of NOR gate 160 is derived from the output of a cooperating NOR gate 161, this output being further supplied via lead 12 to the carry-in terminal $\overline{CI}$ of counter 10. The overflow protection circuit is completed by coupling the output of NAND gate 162 to a second input of NOR gate 161. Normally, counter 10 will be interrogated and cleared before overflow can occur. The overflow protection circuit guarantees that in the exceptional case of fast rotation, a maximum count of the correct polarity will be transferred.

Clock 175, which alternates the flow of detent-passage-representing signals through pulse synchronizer flip-flops 75 and 76, may also be the clock controlling the operation of computing elements 5a, 5b, including whatever convenient code converting circuits 5b, and 3, ..., 3n are necessary to convert the signal output format at the inverter array 6 into a signal format capable of operating a predetermined type of conventional numerical display, such as the digit displays 1, ... 1n of FIG. 7B.

Accordingly, the invention provides a system which electrooptically converts a physical rotational input into electrical pulses for supply to a numerical display device for indicating the amount and direction of the rotation or for computer processing thereof. The invention eliminates difficulties of the prior art by providing an optical pulse-forming switch interfaced via a synchronized flip-flop system with a phase detection and counter control circuit which determines rotation extent and direction. The counter control drives a counter that stores the number of rotational increments passed and stores direction of rotation. The counter is interrogated and reset at regular intervals by a digital computer which converts the input knob angular rotation into a digital quantity by maintaining a running summation of counter values. The operator reference display is brought up to date with the newly converted value following each input conversion.

While the invention has been described in its preferred embodiments, it is to be understood that the words which have been used are words of description rather than of limitation and that changes may be made within the purview of the appended claims without departing from the true scope and spirit of the invention in its broader aspects.

What is claimed is:

1. Angle repeater means adapted for use with angular position pick-off means producing first and second pulse trains upon rotation thereof through an integral number of complete revolutions in a first or in a second direction, said repeater means including:
    clock means,
    first and secon bistable means responsive to said clock means cooperatively forming pulse synchronizer means and respectively responsive to said first and second pulse trains, each said bistable means having respective Q and $\overline{Q}$ outputs,
    phase detector means responsive to said respective Q and $\overline{Q}$ outputs for generating a first control signal representative of the sense of said first or second directions and a second control signal representative of the number of pulses in said first or second pulse trains,
    counter means responsive to said first and second control signals, and
    display means responsive to said clock means and to said counter means for displaying a true numerical measure of the total angular motion of said angular position pick-off means,
    wherein said phase detector means includes:
    third bistable means having a data input responsive to the $\overline{Q}$ output of said first bistable means and a clocking input responsive to the $\overline{Q}$ output of said second bistable means, and
    fourth bistable means having a data input responsive to the $\overline{Q}$ output of said second bistable means and a clocking input responsive to the $\overline{Q}$ output of said first bistable means.

2. Apparatus as described in claim 1 wherein said third and fourth bistable means have respective Q outputs and said phase detector meas further includes first AND gate means responsive to the respective Q outputs of said third and fourth bistable means for cooperatively forming said second control signal for said counter means.

3. Apparatus as described in claim 2 wherein said phase detector means further includes:
    fifth bistable means having a data input responsive to the Q output of said first bistable means and a clocking input responsive to the Q output of said second bistable means, and
    sixth bistable means having a data input responsive to the Q output of said second bistable means and a clocking input responsive to the Q output of said first bistable means.

4. Apparatus as described in claim 3 wherein said fifth and sixth bistable means have respective CLEAR terminals and said phase detector means further includes NOR gate means responsive to the respective Q outputs of said third and fourth bistable means for controlling the CLEAR terminals of said fifth and sixth bistable means.

5. Apparatus as described in claim 4 wherein said fifth and sixth bistable means have respective Q outputs and said first AND gate means is additionally responsive to the Q outputs of said fifth and sixth bistable means.

6. Apparatus as described in claim 5 wherein said counter means has an up-down input terminal and the Q output of said third bistable means is coupled as said first control signal to said counter means up-down input terminal.

7. Apparatus as described in claim 6 wherein said third bistable means has a CLEAR input and said phase detector means further includes:
    second AND gate means responsive to the Q output of said third bistable means and to the Q output of said sixth bistable means, and
    third AND gate means responsive to the $\overline{Q}$ output of said fourth bistable means and to the outputs of said first and second AND gate means for control of the CLEAR input of said third bistable means.

8. Apparatus as described in claim 7 wherein said fourth bistable means has a CLEAR input and said phase detector means further includes:
    fourth AND gate means responsive to the Q output of said fifth bistable means and to the Q output of said fourth bistable means, and
    fifth AND gate means responsive to the $\overline{Q}$ output of said third bistable means and to the outputs of said first and fourth AND gate means for control of the CLEAR input of said fourth bistable means.

9. Apparatus as described in claim 1 further including count protective circuit means coupled in cooperative relation with said counter means for inhibiting the response of said counter means to said second control signal when a count overflow or underflow exists within said counter means.

10. Apparatus described in claim 1 further comprising a rotatable shaft cooperating with said angular position pick-off means and means permitting said rotatable shaft normally to assume any one of a plurality of equiangularly spaced locations.

11. Apparatus as described in claim 10 wherein said means permitting said rotatable shaft means normally to assume any one of a plurality of equiangularly spaced locations comprises detent means.

* * * * *